United States Patent [19]

Matsumoto

[11] Patent Number: 5,698,898
[45] Date of Patent: Dec. 16, 1997

[54] SEMICONDUCTOR APPARATUS WITH A MULTIPLE ELEMENT ELECTRODE STRUCTURE

[75] Inventor: Hideo Matsumoto, Tokyo, Japan

[73] Assignee: Mitsubishi Denki Kabushiki Kaisha, Tokyo, Japan

[21] Appl. No.: 650,995

[22] Filed: May 21, 1996

[30] Foreign Application Priority Data

Dec. 21, 1995 [JP] Japan ................... 7-333100

[51] Int. Cl.⁶ ................... H01L 23/495; H01L 23/34; H01P 1/00
[52] U.S. Cl. ................... 257/712; 257/666; 257/692; 257/698; 257/784; 257/728; 333/247
[58] Field of Search ................... 257/712, 713, 257/714, 718, 666, 692, 698, 787, 788, 789, 790, 791, 784, 728; 333/247

[56] References Cited

FOREIGN PATENT DOCUMENTS 5-82693  4/1993  Japan ................... 257/698

*Primary Examiner*—Carl W. Whitehead, Jr.
*Attorney, Agent, or Firm*—Oblon, Spivak, McClelland, Maier & Neustadt, P.C.

[57] ABSTRACT

A bolt (42a) is connected to a copper plate (9a) by a first electrode (51a), a second electrode (52a) and a wire (10a) for connecting the first and second electrodes. Similarly, a bolt (42b) is connected to a copper plate (9b) by a first electrode (51b), a second electrode (52b) and a wire (10b) for connecting the first and second electrodes. The wires (10a, 10b) are flexible and made of aluminum, for example. Electrical connection can be kept and the upper bound of absorption of the stress applied between the bolts (42a, 42b) and the copper plates (9a, 9b) can be increased.

12 Claims, 5 Drawing Sheets

SEMICONDUCTOR APPARATUS WITH A MULTIPLE ELEMENT ELECTRODE STRUCTURE

BACKGROUND OF THE INVENTION

1. Field of the Invention

The present invention relates to a power module using a power semiconductor device.

2. Description of the Background Art

FIG. 7 is a sectional view showing the structure of a power module 200 according to the background art. The power module 200 has the function of controlling power by a semiconductor device 1.

An insulating substrate 2 has copper plates 9a and 9b provided on a surface 2a and a copper plate 9c provided on a back 2b. The semiconductor device 1 is connected to the copper plates 9a and 9b. The copper plates 9a and 9b are connected to bolts 42a and 42b through electrode leading portions 5a and 5b respectively. The bolts 42a and 42b function as output terminals. The copper plates 9a and 9b are connected to the electrode leading portions 5a and 5b by means of a solder 8. A copper having good conductivity is used for the electrode leading portions 5a and 5b.

The copper plate 9c is stuck to a base plate 3 by means of the solder 8. The semiconductor device 1 is electrically insulated by the insulating substrate 2 so that safe handling can be kept. In addition, heat is radiated from the semiconductor device 1 by the base plate 3 or an external heat radiator fixed to the base plate 3. The base plate 3 is formed of a copper having good heat conductivity.

An insulating package 6, together with the base plate 3, encloses the semiconductor device 1, the insulating substrate 2, and the electrode leading portions 5a and 5b. In order to electrically insulate the electrode leading portions 5a and 5b from each other effectively, the space enclosed by the package 6 and the base plate 3 is filled with an insulating silicone gel 7, for example.

The base plate 3 is stuck to the insulating substrate 2 through the copper plate 9c and the solder 8. For this reason, a warp occurs on the base plate 3 due to a difference in expansion coefficient of respective materials at a room temperature after soldering. Consequently, a stress is applied to the copper plate 9c and the electrode leading portions 5a and 5b so that the copper plate 9c is peeled and the life of the electrode leading portions 5a and 5b is shortened.

In order to prevent the foregoing, it is also possible to apply a warp to the base plate 3 in advance in the opposite direction to a warp which may be caused. However, it is hard to apply, in advance, the warp to the base plate 3 having a water channel formed therein so as to function as a water-cooled fin.

Referring to the power module according to the background art, the electrode leading portions 5a and 5b have the shape of a U-bend, and are designed in such a manner that the stress applied to the electrode leading portions 5a and 5b can be relieved or a difference in dimension during processing can be absorbed. However, the range of the stress which can be absorbed is the same as that of the elastic limit of a material which forms the electrode leading portions 5a and 5b. In any case, the upper boundary of the stress which can be absorbed by the electrode leading portions 5a and 5b each being formed in a single structure is not always high.

In order to reduce a warp caused by a difference in thermal expansion coefficient between the base plate 3 and the insulating substrate 2, it is desired that their areas are decreased. Accordingly, it is necessary to reduce a space between the electrode leading portions 5a and 5b on the insulating substrate 2. Since the shape of a U-bend is employed in order to relieve the stress, it is difficult to make a space L0 between the electrode leading portions 5a and 5b in the vicinity of the output terminals 42a and 42b greater than a space between the electrode leading portions 5a and 5b on the insulating substrate 2.

Referring to the structure according to the background art, it is necessary to fill almost the whole space enclosed by the package 6 and the base plate 3 with the gel 7 in order to effectively insulate the electrode leading portions 5a and 5b from each other.

However, the gel 7 is expensive, and its linear expansion coefficient is about 10 times as much as that of a copper. Accordingly, it is not desired that a lot of gel 7 is used for the power module.

SUMMARY OF THE INVENTION

A first aspect of the present invention is directed to a semiconductor apparatus comprising a heat radiating plate, a semiconductor device in which heat is radiated from the heat radiating plate, an insulating substrate that includes a first face having a circuit pattern on which the semiconductor device is placed, and a second face with which the heat radiating plate comes in contact, an insulating case which includes a bottom and a side and encloses the semiconductor device together with the first face of the insulating substrate, and at least one electrode leading portion which is connected to the semiconductor device through the circuit pattern and penetrates the case, wherein the at least one electrode leading portion each includes a first electrode which is electrically connected and fixed to the circuit pattern, a second electrode fixed to the case, and a conductor which is flexible and electrically connects the first electrode to the second electrode.

A second aspect of the present invention is directed to the semiconductor apparatus according to the first aspect of the present invention, wherein the second electrode is provided on the bottom of the case, the first and second electrodes have horizontal portions in the vicinity of the conductor, the horizontal portions being almost on a level with each other from the insulating substrate, and an opening is provided on a part of the bottom of the case.

A third aspect of the present invention is directed to the semiconductor apparatus according to the second aspect of the present invention, wherein the horizontal portions of the first and second electrodes are backed with a reinforcing member on the opposite side to the opening.

A fourth aspect of the present invention is directed to the semiconductor apparatus according to the first aspect of the present invention, wherein the at least one electrode leading portion is a plurality of electrode leading portions, and the case further comprises an insulating projection which extends from the bottom to the heat radiating plate between the plurality of electrode leading portions which are provided adjacently to each other.

A fifth aspect of the present invention is directed to the semiconductor apparatus according to the first aspect of the present invention, wherein the at least one electrode leading portion is a plurality of electrode leading portions, the first electrodes which are provided adjacently to each other are bent back to back with each other, and a space between the second electrodes corresponding to the first electrodes respectively is greater than a space between the first electrodes.

According to the first aspect of the present invention, the conductor provided between the first and second electrodes is flexible. Consequently, the upper bound of absorption of the stress caused by a warp which is due to a difference in expansion coefficient between the insulating substrate and the heat radiating plate can be increased.

According to the second aspect of the present invention, it is easy to connect the horizontal portions of the first and second electrodes by the conductor through the opening. Moreover, a connecting mulfanction with time can easily be checked via the opening from outside.

According to the third aspect of the present invention, the semiconductor apparatus is resistant to the impact of wire bonding which is performed when connecting the first and second electrodes to each other by the conductor. The reinforcing member is backed so that the horizontal portions which have good productivity and are resistant to the impact can be obtained.

According to the fourth aspect of the present invention, the distance related to the insulation of the electrode leading portions each other can be increased substantially. Consequently, a small amount of a gel for insulation is enough. The expansion coefficient of the gel is greater than the expansion coefficients of other members. Accordingly, the small amount of the gel can reduce the warp of each portion and the manufacturing cost.

According to the fifth aspect of the present invention, the space between the second electrodes is increased to enhance insulation therebetween. For this reason, the gel for covering this portion is not required. The expansion coefficient of the gel is greater than the expansion coefficients of other members. Accordingly, the small amount of the gel can reduce the warp of each portion. Furthermore, the space between the first electrodes can be reduced. Consequently, the size of the insulating substrate can be reduced. Accordingly, the stress caused by the warp which is due to the difference in expansion coefficient between the insulating substrate and the heat radiating plate can be inhibited from occurring.

In order to solve the above problems, it is an object of the present invention to provide the technology in which the upper bound of a stress which can be relieved is increased and the amount of an insulating gel to be required is decreased.

This and other objects, features, aspects and advantages of the present invention will become more apparent from the following detailed description of the present invention when taken in conjunction with the accompanying leadings.

DESCRIPTION OF THE PREFERRED EMBODIMENTS

<First Embodiment>

Figure 1:
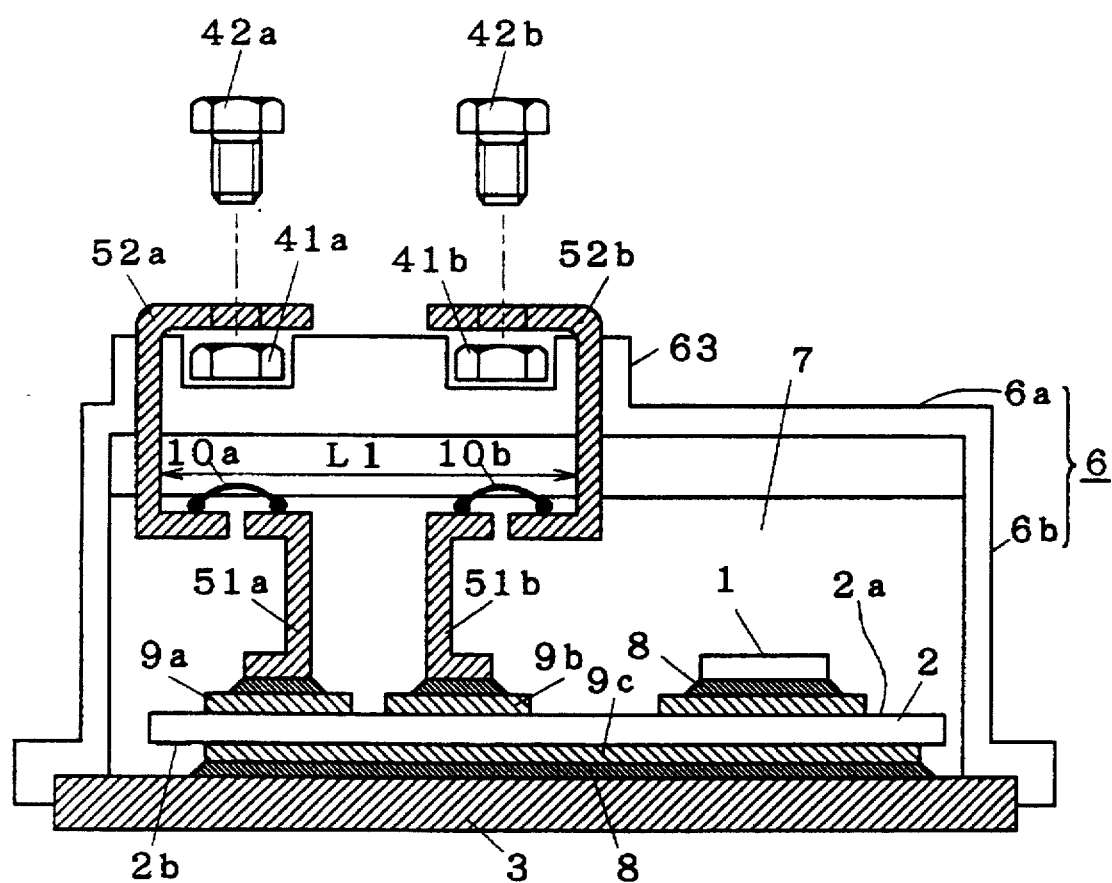
FIG. 1 is a sectional view showing the structure of a semiconductor apparatus according to a first embodiment of the present invention.
Figure 2:
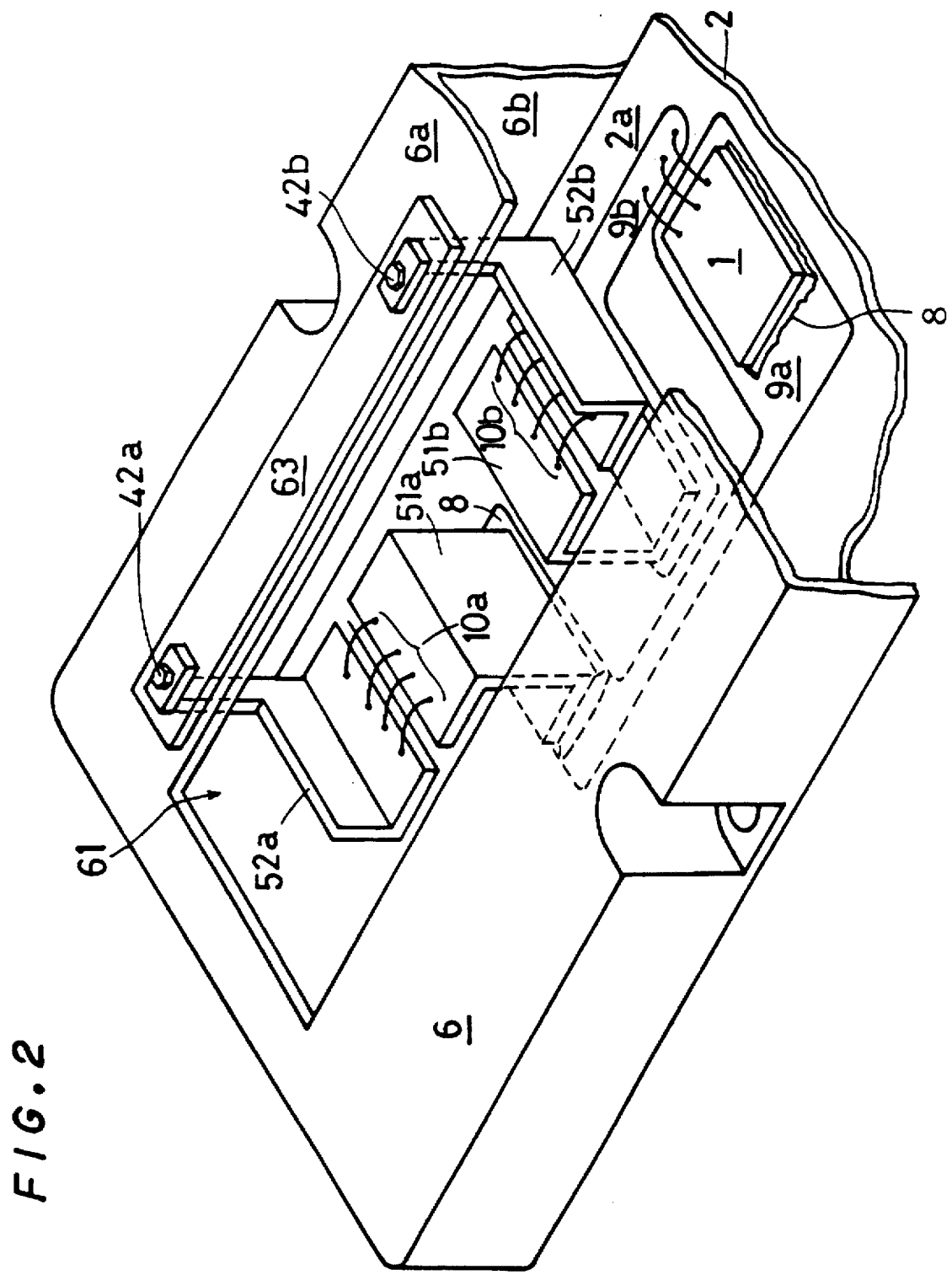
FIG. 2 is a perspective view showing the structure of the semiconductor apparatus according to the first embodiment of the present invention.

FIG. 1 is a sectional view showing the structure of a power module 101 which is a semiconductor apparatus according to a first embodiment of the present invention. The power module 101 has the function of controlling power by a semiconductor device 1. FIG. 2 is a perspective view showing the structure of the power module 101, which is partly broken and has a base plate 3 omitted.

Copper plates 9a and 9b are provided on a surface 2a of an insulating substrate 2. For example, copper is patterned by etching or the like so that the copper plates 9a and 9b are formed. A copper plate 9c is provided on a back 2b of the insulating substrate 2.

The semiconductor device 1 has a back stuck to the copper plate 9a by means of a solder 8 and a surface electrically connected to the copper plate 9b.

First electrodes 51a and 51b are electrically connected and fixed to the copper plates 9a and 9b by means of the solder 8.

The base plate 3 is stuck to the back 2b of the insulating substrate 2 through the copper plate 9c by means of the solder 8. Electrical insulation can be kept for the semiconductor device 1 by the insulating substrate 2 and heat can be radiated from the semiconductor device 1 onto the base plate 3.

Figure 3:
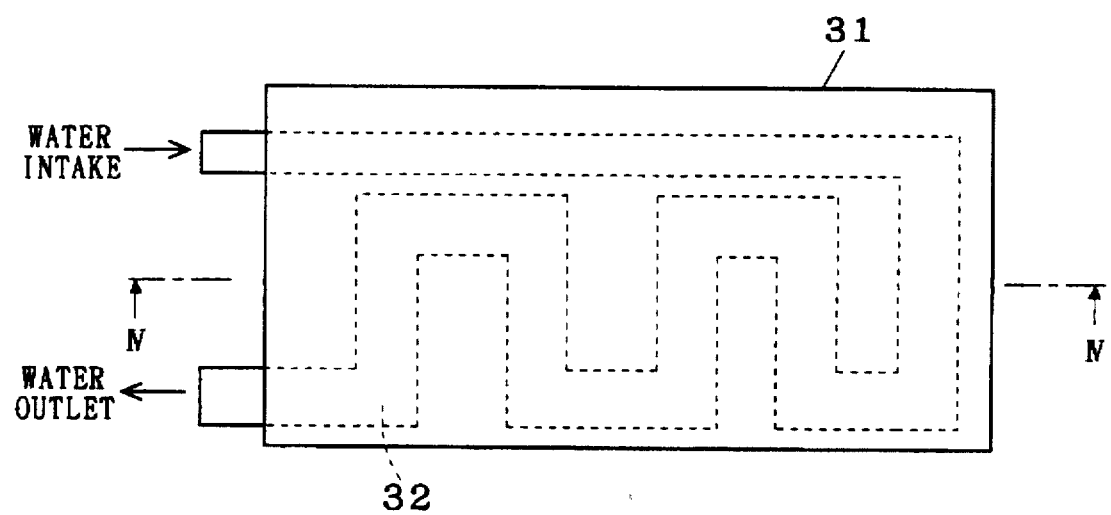
FIG. 3 is a front view showing the structure of the semiconductor apparatus according to the first embodiment of the present invention.
Figure 4:
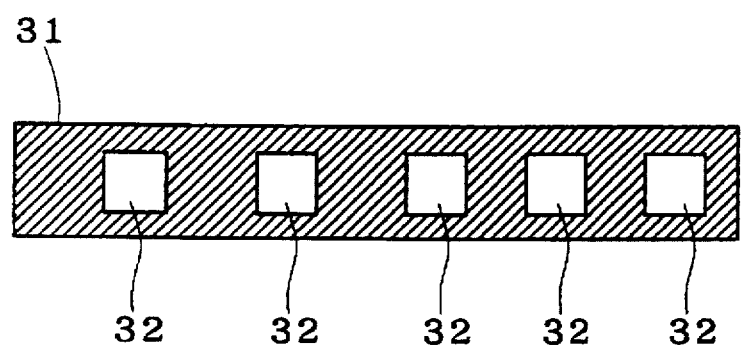
FIG. 4 is a sectional view showing the structure of the semiconductor apparatus according to the first embodiment of the present invention.

FIG. 3 is a front view showing the structure of a water-cooled fin 31 which can be employed as the base plate 3. FIG. 4 is a sectional view showing the section taken along the line IV—IV shown in FIG. 3. A water channel 32 is provided in the water-cooled fin 31. The preferred embodiments which will be described below have such a structure that can also be applied to the case where a warp is hard to process.

A package 6 is comprised of a bottom 6a which is opposed to the base plate 3, and a side 6b, and has insulating properties. In addition, the package 6, together with the base plate 3, encloses the semiconductor device 1, the insulating substrate 2, and the first electrodes 51a and 51b.

Second electrodes 52a and 52b are fixed to the bottom 6a of the package 6 with nuts 41a and 41b and bolts 42a and 42b respectively. The bolts 42a and 42b function as output terminals. The nuts 41a and 41b are fixed to a convex portion 63 which is provided on the bottom 6a. For example, holes in which the nuts 41a and 41b are fitted are provided on the convex portion 63 so that the above fixation can be performed.

According to the present invention, each of electrode leading portions for connecting the copper plates 9a and 9b to the bolts 42a and 42b as output terminals is not formed in a single structure but has three parts respectively. For example, the bolt 42a is connected to the copper plate 9a by the first electrode 51a, the second electrode 52a, and a wire 10a for connecting the first and second electrodes 51a and 52a. Similarly, the bolt 42b is connected to the copper plate 9b by the first electrode 51b, the second electrode 52b, and a wire 10b for connecting the first and second electrodes 51b and 52b. The wires 10a and 10b are flexible and made of aluminum, for example. The wires 10a and 10b perform the above connection by wire bonding or the like.

Thus, the electrode leading portion is comprised of a plurality of elements. In particular, the flexible wires are used. Consequently, electrical connection can be kept and the upper boundary of absorption of the stress applied between the bolts 42a, 42b and the copper plates 9a, 9b can be increased. More specifically, even if the warp of the base plate 3 is caused by a difference in expansion coefficient between the base plate 3 and the insulating substrate 2, the solder 8 or the insulating substrate 2 seldom cracks as compared with the background art.

It is desired that the portions of the first electrodes 51a, 51b and the second electrodes 52a, 52b which are bonded by the wires 10a and 10b are horizontal, i,e., parallel with the base plate 3. It is desired that the portion of the bottom 6a of the package 6 which is provided above the horizontal portions has an opening 61. The reason is that it is possible to fix the second electrodes 52a and 52b to the bottom 6a of the package 6 in advance, and put the package 6 on the base plate 3 to which the first electrodes 51a and 51b have already been fixed to perform wire bonding through the opening 61 so that the assembly work can be executed efficiently.

Moreover, the installation of the opening 61 makes it possible to understand from outside connecting conditions among the first electrodes 51a, 51b, the second electrodes 52a, 52b, and the wires 10a, 10b so that a malfunction with time, such as peeling of wires, fusion and so on, can easily be checked.

It is desired that the first electrodes 51a and 51b are bent back to back with each other as shown in FIG. 1. It is not necessary to employ a U-shape for relieving the stress according to the background art. Consequently, a folded pattern is not required so that a distance L1 between the second electrodes 52a and 52b can be made greater than a distance between the first electrodes 51a and 51b on the insulating substrate 2. In other words, the first electrodes 51a and 51b can be insulated from each other better while reducing the area which is necessary for the insulating substrate 2.

Accordingly, the warp of the base plate 3 can be reduced and the amount of the gel 7 which is required can be decreased. The amount of the gel 7 to immerse the horizontal portions of the second electrodes 52a and 52b is required. A small amount of the gel 7 to be used is enough so that the stress can be inhibited from occurring and manufacturing costs can be reduced.

<Second Embodiment>

Figure 5:
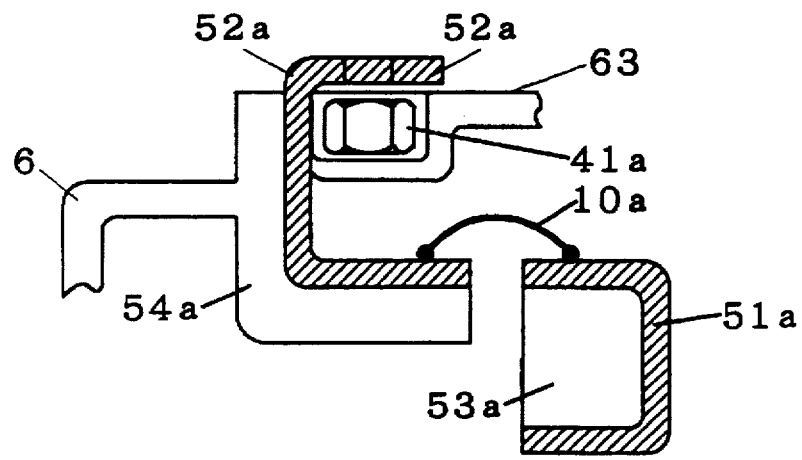
FIG. 5 is a sectional view showing a part of a semiconductor apparatus according to a second embodiment of the present invention.

FIG. 5 is a sectional view showing the vicinity of the improved power module 101 as a semiconductor apparatus according to a second embodiment of the present invention. The horizontal portions of first and second electrodes 51a and 52a which are bonded by a wire 10a are reinforced by backing portions 53a and 54a respectively. Consequently, the resistance to an impact load can be increased during the bonding of the wire 10a. Thus, automatic connection can be performed by a wire bonder.

It is desired that the backing portion 54a is integrated with a package 6 as shown in FIG. 5. The reason is that productivity can be enhanced as compared with the case where a backing material is provided separately. For the same reason, it is desired that the backing portion 53a is formed of a molding resin integrated with the first electrode 51a.

Needless to say, it is desired that the backing portion is provided on the first and second electrodes 51b and 52b.

<Third Embodiment>

Figure 6:
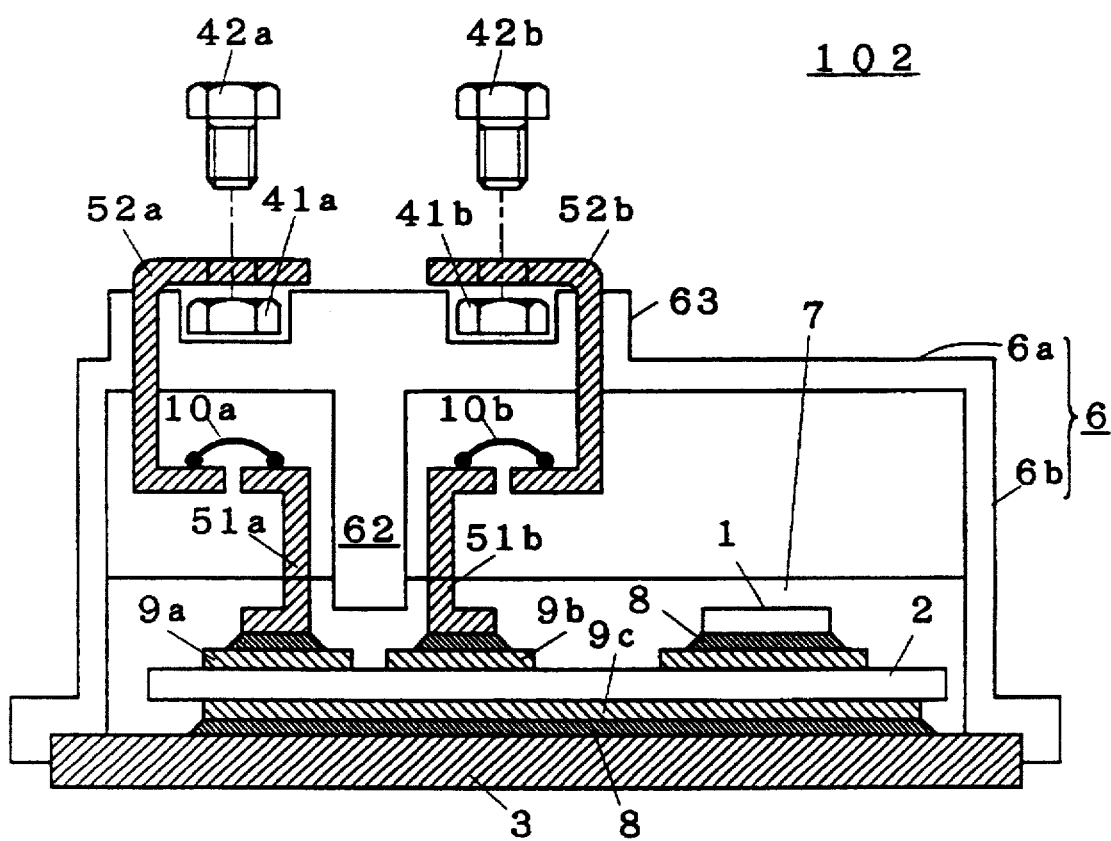
FIG. 6 is a sectional view showing the structure of a semiconductor apparatus according to a third embodiment of the present invention.
Figure 7:
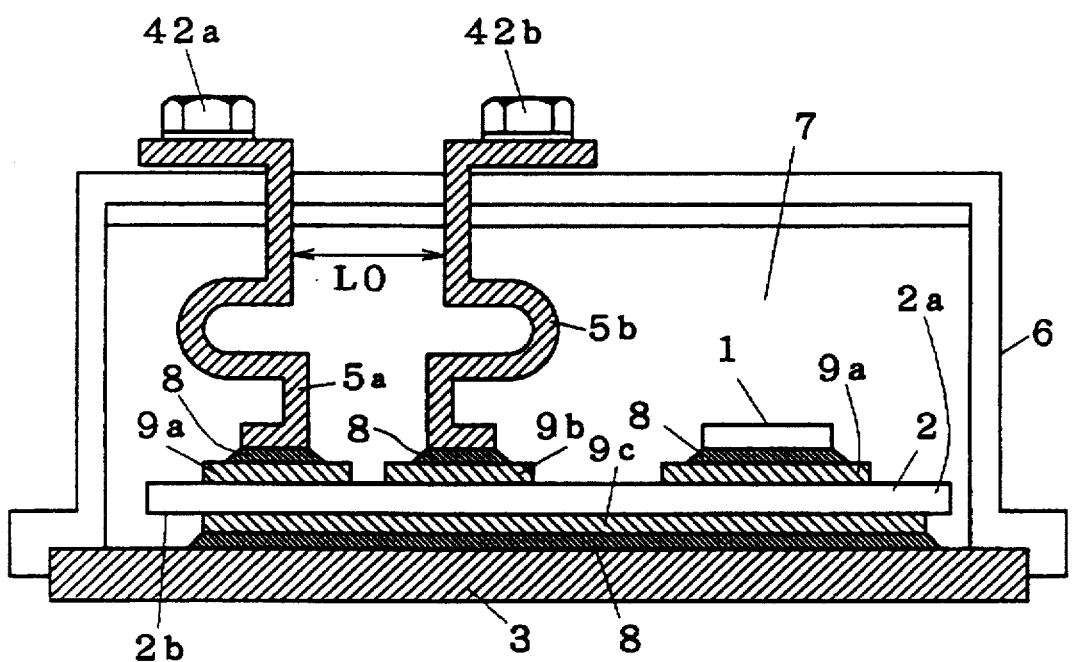
FIG. 7 is a sectional view showing the structure of a power module according to the background art.

FIG. 6 is a sectional view showing the structure of a power module 102 which is a semiconductor apparatus according to a third embodiment of the present invention. As compared with the power module 101, the power module 102 is improved in that a projection 62 is provided on a bottom 6a of a package 6.

The projection 62 is inserted between first electrodes 51a and 51b which are provided adjacently to each other. For this reason, the distances between the first and second electrodes 51a, 52a and the first and second electrodes 51b, 52b can be made effectively greater up to the tip of the projection 62 from a view of electrical insulation.

Accordingly, the amount of the gel 7 to immerse the tip of the projection 62 is required. With respect to the amount of the gel 7, better effects can be obtained than in the first embodiment.

While the invention has been described in detail, the foregoing description is in all aspects illustrative and not restrictive. It is understood that numerous other modifications and variations can be devised without departing from the scope of the invention.

I claim:

1. A semiconductor apparatus comprising:

a heat radiating plate;

a semiconductor device whose heat is radiated from said heat radiating plate;

an insulating substrate that includes a first face having a circuit pattern on which said semiconductor device is placed, and a second face with which said heat radiating plate comes in contact;

an insulating case which includes a bottom and a side and encloses said semiconductor device together with said first face of said insulating substrate; and at least one electrode leading portion which is connected to said semiconductor device through said circuit pattern and penetrates said case, wherein each of said at least one electrode leading portion includes:

a first electrode which is electrically connected and fixed to said circuit pattern;

a second electrode fixed to said case; and a conductor parallel to said heat radiating plate which is flexible and electrically connects said first electrode to said second electrode.

2. The semiconductor apparatus according to claim 1, wherein said second electrode is provided on said bottom of said case, said first and second electrodes have horizontal portions in the vicinity of said conductor, said horizontal portions being almost on a level with each other from said insulating substrate, and an opening is provided on a part of said bottom of said case.

3. The semiconductor apparatus according to claim 2, wherein said horizontal portions of said first and second electrodes are backed with a reinforcing member on the opposite side to said, opening.

4. The semiconductor apparatus according to claim 1, wherein said at least one electrode leading portion is a plurality of electrode leading portions, and said case further comprises an insulating projection which extends from said bottom to said heat radiating plate between said plurality of electrode leading portions which are provided adjacently to each other.

5. The semiconductor apparatus according to claim 1, wherein said at least one electrode leading portion is a plurality of electrode leading portions, said first electrodes which are provided adjacently to each other are bent back to back with each other, and a space between said second electrodes corresponding to said first electrodes respectively is greater than a space between said first electrodes.

6. A semiconductor apparatus comprising:

a heat radiating plate;

a semiconductor device whose heat is radiated from said heat radiating plate;

an insulating substrate that includes a first face having a circuit pattern on which said semiconductor device is placed, and a second face with which said heat radiating plate comes in contact;

an insulating case which includes a bottom and a side and encloses said semiconductor device together with said first face of said insulating substrate; and at least one electrode leading portion which is connected to said semiconductor device through said circuit pattern and penetrates said case, wherein each of said at least one electrode leading portion includes:

first electrode which is electrically connected and fixed to said circuit pattern;

a second electrode provided on said bottom of said case; and a conductor which is flexible and electrically connects said first electrode to said second electrode;

wherein said first and second electrodes have horizontal portions in the vicinity of said conductor, said horizontal portions being almost on a level with each other from said insulating substrate, wherein an opening is provided on a part of said bottom of said case, and wherein said horizontal portions of said first and second electrodes are backed with a reinforcing member on the opposite side to said opening.

7. The semiconductor apparatus according to claim 6, wherein said at least one electrode leading portion is a plurality of electrode leading portions, and said case further comprises an insulating projection which extends from said bottom to said heat radiating plate between said plurality of electrode leading portions which are provided adjacently to each other.

8. The semiconductor apparatus according to claim 6, wherein said at least one electrode leading portion is a plurality of electrode leading portions, said first electrodes which are provided adjacently to each other are bent back to back with each other, and a space between said second electrodes corresponding to said first electrodes respectively is greater than a space between said first electrodes.

9. A semiconductor apparatus comprising:

a heat radiating plate;

a semiconductor device whose heat is radiated from said heat radiating plate;

an insulating substrate that includes a first face having a circuit pattern on which said semiconductor device is placed, and a second face with which said heat radiating plate comes in contact;

an insulating case which includes a bottom and a side and encloses said semiconductor device together with said first face of said insulating substrate; and a plurality of electrode leading portions which are connected to said semiconductor device through said circuit pattern and penetrates said case, wherein each of said plurality of electrode leading portions includes:

a first electrode which is electrically connected and fixed to said circuit pattern;

a second electrode fixed to said case; and a conductor which is flexible and electrically connects said first electrode to said second electrode; and wherein said first electrodes which are provided adjacently to each other are bent back to back with each other, and a space between said second electrodes corresponding to said first electrodes respectively is greater than a space between said first electrodes.

10. The semiconductor apparatus according to claim 9, wherein said second electrode is provided on said bottom of said case, said first and second electrodes have horizontal portions in the vicinity of said conductor, said horizontal portions being almost on a level with each other from said insulating substrate, and an opening is provided on a part of said bottom of said case.

11. The semiconductor apparatus according to claim 10, wherein said horizontal portions of said first and second electrodes are backed with a reinforcing member on the opposite side to said opening.

12. The semiconductor apparatus according to claim 9, wherein said case further comprises an insulating projection which extends from said bottom to said heat radiating plate between said plurality of electrode leading portions which are provided adjacently to each other.

* * * * *